United States Patent
Lin

(10) Patent No.: US 6,309,937 B1
(45) Date of Patent: Oct. 30, 2001

(54) METHOD OF MAKING SHALLOW JUNCTION SEMICONDUCTOR DEVICES

(75) Inventor: Xi-Wei Lin, Fremont, CA (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/303,830

(22) Filed: May 3, 1999

(51) Int. Cl.[7] .................................................. H01L 21/336
(52) U.S. Cl. ......................... 438/305; 438/304; 438/306
(58) Field of Search ..................................... 438/305, 303, 438/307, 308, 304, 306

(56) References Cited

U.S. PATENT DOCUMENTS

| | | |
|---|---|---|
| 4,728,617 | 3/1988 | Woo et al. . |
| 4,784,965 | 11/1988 | Woo et al. . |
| 4,978,626 | 12/1990 | Poon et al. . |
| 4,994,404 | 2/1991 | Sheng et al. . |
| 5,168,072 | 12/1992 | Moslehi . |
| 5,200,352 | 4/1993 | Pfiester . |
| 5,514,610 * | 5/1996 | Wann et al. ........................ 438/305 |
| 5,527,721 | 6/1996 | Farb . |
| 5,585,295 | 12/1996 | Wu . |
| 5,595,919 | 1/1997 | Pan . |
| 5,610,088 | 3/1997 | Chang et al . |
| 5,693,546 | 12/1997 | Nam et al. . |
| 5,736,446 | 4/1998 | Wu ........................................ 438/305 |
| 5,747,372 | 5/1998 | Lim ...................................... 438/298 |
| 5,750,430 | 5/1998 | Son ...................................... 438/303 |
| 5,759,897 | 6/1998 | Kadosh et al. ....................... 438/286 |
| 5,770,506 | 6/1998 | Koh ...................................... 438/303 |
| 5,780,350 | 7/1998 | Kapoor ................................ 438/305 |
| 5,783,475 | 7/1998 | Ramaswami ......................... 438/303 |
| 5,895,955 | 4/1999 | Gardner et al. ...................... 257/336 |
| 5,946,581 * | 8/1999 | Gardner et al. ...................... 438/307 |
| 6,040,222 * | 3/2000 | Hsu et al. ............................. 438/301 |

FOREIGN PATENT DOCUMENTS

| | | | |
|---|---|---|---|
| 0 450 432 A1 | 10/1991 | (EP) | H01L/29/784 |
| 04 023439 A | 1/1992 | (JP) | H01L/21/336 |

OTHER PUBLICATIONS

English Abstract of Japanese Patent Publication, 04 023439A, Date of Publication Jan. 27, 1992.

* cited by examiner

Primary Examiner—David Nelms
Assistant Examiner—Dung Aug Le
(74) Attorney, Agent, or Firm—Woodard, Emhardt, Naughton, Moriarty & McNett

(57) ABSTRACT

Disclosed is a technique to provide an integrated circuit substrate with a transistor gate member that has opposing sidewalls. A first spacer extends from one of the sidewalls and a second spacer extends from another of the sidewalls. A source region and a drain region of the substrate are doped, with the first and second spacers correspondingly masking first and second regions of the substrate. The first and second spacers are removed after doping and the first and second regions are exposed. The exposed first and second regions are then doped. The substrate is heated after this second doping stage to simultaneously activate dopant in the source region, the drain region, the first region, and the second region. A third spacer is then formed on the first region and a fourth spacer is then formed on the second region. A suicide contact is established with at least the transistor member, the source region, or the drain region after formation of the third and fourth spacers.

34 Claims, 4 Drawing Sheets

METHOD OF MAKING SHALLOW JUNCTION SEMICONDUCTOR DEVICES

BACKGROUND OF THE INVENTION

The present invention relates to the provision of an improved semiconductor device and techniques for making such a device. More particularly, but not exclusively, the present invention relates to the formation of shallow semiconductor junctions for such devices.

To increase the speed of electronic devices, it is often desirable to decrease the critical dimension of various semiconductor components. Concomitantly, functionality of many integrated circuit devices may be increased by reducing the size of individual components so that the component density, and correspondingly the number and complexity of integrated circuits formed from the components may be increased. Also, as the critical dimension of semiconductor devices is scaled down into the submicron range, it is often desirable to maintain a shallow, tightly distributed junction profile. Unfortunately, conventional processing often exposes junction forming dopants to multiple, high temperature thermal cycles that tend to deepen the corresponding profile. Consequently, there is a demand for better techniques to maintain a desired junction profile depth. Moreover, for semiconductor devices having a critical dimension deep in the submicron range ($\leq 0.2$ microns) the formation of correspondingly shallower junctions is often desired and the maintenance of such profiles often becomes even more significant for proper device performance. Thus, there is also a need for techniques to reliably provide shallower semiconductor junctions.

SUMMARY OF THE INVENTION

One form of the present invention is an improved integrated circuit device, including a shallow semiconductor junction. Alternatively or additionally, an improved integrated circuit device of another form of the present invention may include a pair of opposing sidewall spacers that each extend over a source/drain extension and overlap an adjacent source/drain region.

In another form of the present invention, a technique is provided to reduce or eliminate thermal cycles that may cause unwanted deepening of a semiconductor junction or that may otherwise undesirably redistribute junction dopants. This technique maybe used to provide a device with an ultra-shallow junction. As used herein, "an ultra-shallow junction" refers to a junction having a maximum depth of less than about 1000 Angstroms (Å) with a dopant level of at least $10_{19}$ cm$^{-3}$. Moreover, ultra-shallow junctions having a preferred depth of less than about 500 Å may be provided in accordance with this form.

In yet another form, an integrated circuit device is doped with one or more masking members located to selectively block doping of certain substrate regions. These members are then removed and at least a portion of each of the blocked regions is doped with a different profile characteristic relative to the first doping process. After the second doping process, new blocking or masking members may be formed that cover at least a portion of the regions doped to the second nonzero level. These new masking members may be sized differently than the masking members that were removed. In one variation of this form, the new masking members are configured as transistor gate spacers that may be sized and shaped to facilitate subsequent processing, such as suicide formation.

In a different form of the present invention, a method comprises doping an integrated circuit substrate to provide a first pair of doped substrate regions, with a transistor gate member and a corresponding first pair of spacers extending from the substrate between the first doped regions. The first spacers are then removed. After spacer removal, doping of the substrate takes place to provide a second pair of doped substrate regions with a different profile than the first doped regions. These second doped regions are each positioned along the substrate between a corresponding one of the first doped regions and the gate member. The substrate is heated to activate dopant of the first and second doped regions. A second pair of spacers is formed about the gate member after the second doped regions are formed. A suicide contact is provided on at least one of the first doped regions or the gate member after formation of the second pair of spacers.

Another form of the present invention includes performing a first dopant implant into a source region and a drain region of an integrated circuit substrate. A transistor gate member extends from the substrate between the source and drain regions, and a first pair of spacers bounds the gate member with one of the first spacers masking a first region between the source region and the gate member during the first implant and another of the first spacers masking a second region between the drain region and the gate member during first implant. The first spacers are each formed from tetraethylorthosilicate (TEOS). The first spacers are etched away after the first implant, and a second dopant implant is performed to dope the first and second regions relative to the source and drain regions with a dopant of the same conductivity type as implanted in the source and drain regions. A second pair of spacers are then formed about the gate member.

Yet another form includes providing an integrated circuit substrate with a transistor gate member extending therefrom that is bounded by a first pair of spacers, and doping the substrate to provide a first pair of doped substrate regions. The gate member and the first spacers are positioned between the first doped regions. The first spacers are removed and the substrate is doped after the first spacer removal to provide a second pair of doped substrate regions. The second doped substrate regions are each positioned along the substrate between a corresponding one of the first doped regions and the gate member. A second pair of spacers are formed that each extend along the substrate from a sidewall of the gate member over a corresponding one of the second doped regions, and that each include a downwardly sloped surface positioned below a top surface of the gate member. The second spacers may each be wider than a respective one of the first spacers to at least partially extend over a corresponding one of the first doped regions.

Accordingly, it is one object of the present invention to provide an improved electronic device.

It is another object of the invention to provide techniques for manufacturing a shallow junction semiconductor device.

Further objects, features, aspects, forms, embodiments, benefits, and advantages of the present invention shall become apparent from the description and drawings contained herein.

BRIEF DESCRIPTION OF THE DRAWINGS

In FIGS. 1–7, like reference numerals represent like features; and in some cases, the figures or selected features thereof are not drawn to scale to preserve clarity.

DETAILED DESCRIPTION OF THE PREFERRED EMBODIMENTS

Figure 1:
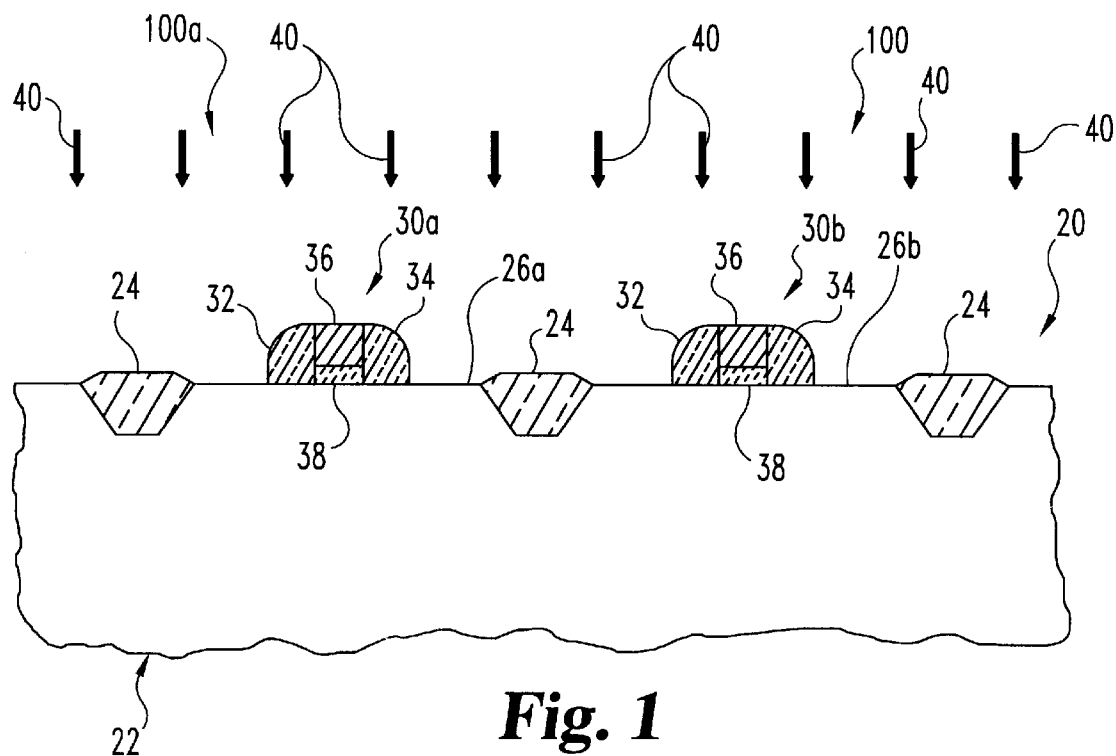
FIGS. 1–7 are partial, sectional views of an integrated circuit device depicting selected progressive stages of manufacture.

For the purpose of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

FIGS. 1–7 illustrate selected stages of a manufacturing process 100 for integrated circuit device 20. In stage 100a of FIG. 1, integrated circuit device 20 includes substrate 22. It is preferred that substrate 22 be generally planar and formed from a common semiconductor material such as a single-crystal silicon; however, other geometries, compositions, and arrangements of substrate 22 are also contemplated as would occur to those skilled in the art. As depicted, substrate 22 generally extends along a plane perpendicular to the view plane of FIG. 1. It is also preferred that substrate 22 be initially p- or n-doped as appropriate for the particular type of semiconductor junctions desired to be formed within substrate 22 during later processing stages.

A number of isolation structures 24 are depicted in FIG. 1. Structures 24 are spaced apart from each other to define a corresponding number of electrically isolated component regions, a pair of which are specifically designated by reference numerals 26a and 26b. Preferably, isolation structures 24 are each of a standard Shallow Trench Isolation (STI) type; however, in other embodiments, one or more different isolation structure types may alternatively or additionally be utilized. In still other embodiments, isolation structures 24 may be absent, and correspondingly regions 26a, 26b may not be electrically isolated from each other.

Transistor gate structures 30a, 30b are each depicted in a corresponding one of regions 26a, 26b. Strictures 30a, 30b each include a pair of spacers 32, 34 extending from opposing sidewalls of gate member 36. Each structure 30a, 30b also has dielectric gate pad 38 positioned between member 36 and substrate 22 to electrically insulate members 36 from substrate 22. Each spacer 32, 34 has a curved cross-sectional profile that extends downwardly from member 36 towards substrate 22.

Preferably, structures 30a, 30b are formed simultaneously. In one preferred embodiment, simultaneous formation begins with deposition of a dielectric layer on substrate 22. This layer is then blanketed by a layer of amorphous silicon using standard techniques. A photoresist layer is then applied and patterned using common photolithographic procedures to provide a mask for the dielectric and amorphous silicon layers. In accordance with this mask, selected regions of these layers are removed by etching to form pads 38 from the dielectric layer and gate members 36 from the amorphous silicon layer. Structures 30a, 30b as shown in FIG. 1 result. Typically, the amorphous silicon is converted to a polycrystalline form by heating or annealing stages of the manufacturing process. This polycrystalline form is sometimes designated "polysilicon" or "poly".

Preferably, members 36 are formed at this or subsequent stages in a manner that they become electrically conductive relative to pads 38. Members 36 are comprised of a material including silicon arranged in a manner suitable to selectively form a silicide film during subsequent processing. For a polysilicon composition of members 36, conductivity may be established by applying dopant to members 36. If a dopant is applied to members 36, it is preferably applied at the same time that another region of device 20 is being doped, such as substrate 22. In other embodiments, conductivity of members 36 may be established in a different manner, such as by partially or completely forming member 36 from a metal. In one such instance, material from which member 36 is initially formed is partially or completely removed and replaced by a metal during later stages of manufacture. For such alternatives, members 36 may not include silicon arranged for the later formation of a silicide. Moreover, members 36 may initially or subsequently be formed from multiple layers or films each comprised of a different material; where such layers or films may not include silicon or a silicide. In other embodiments, members 36 may be otherwise formed as would occur to those skilled in the art.

Preferably, pads 38 are each formed from a dielectric that, in cooperation with the corresponding member 36 is suitable to provide an insulated gate for an Insulated Gate Field Effect Transistor (IGFET). In one preferred arrangement, pads 38 are comprised of silicon dioxide and have a thickness of less than or equal to about 60 angstroms. Alternatively, pads 38 may be composed, sized, or arranged as would occur to those skilled in the art.

After formation, members 36 may be oxidized to provide an outer film comprised of silicon dioxide utilized in the formation of spacers 32, 34. Indeed, it is preferred that spacers 32, 34 be formed from an insulating material. More preferably, spacers 32, 34 of each structure 30a, 30b are formed from a thermally grown layer of silicon dioxide on the sidewalls of members 36 and a blanket of undensified tetraethylorthosilicate (TEOS) that is deposited on device 20 and then selectively removed to provide spacers 32, 34 with a cross-sectional profile as generally shown in FIG. 1. As used herein, "undensified TEOS" refers to as-deposited silicon oxide formed by a TEOS based Chemical Vapor Deposition (CVD) process. For this more preferred embodiment, a plasma etching technique is preferred to selectively remove the TEOS material to shape spacers 32, 34. In other embodiments, a different composition and/or formation procedure may be utilized for spacers 32, 34 as would occur to those skilled in the art.

In stage 100a, selected regions of device 20 are doped as symbolically represented by arrows 40. Preferably, this doping operation is performed by ion implantation of one or more suitable species to provide a n+ or p+ doped region. By way of nonlimiting example, for a n+ conductivity type, arsenic (As) or phosphorous (P) may be implanted; and for the p+ conductivity type, boron (B) may be implanted in the form of a B11 or $BF_2$ species. In either case, the preferred minimum dopant level is about $4 \times 10^{19}$ $cm^{-3}$. This doping procedure may include application of a photoresist mask using standard techniques to prevent doping of one or more regions of device 20. For example, such a mask may be desired to prevent doping of one or more members 36. Also, Such masks are sometimes used to provide both n-type and p-type transistors on the same device that may be paired in CMOS applications of the present invention. Nonetheless, such photoresist masks are not shown in FIG. 1 to preserve clarity. For doping procedures including implantation, a screen implant layer such as an oxide film, may be utilized, and may be subsequently removed. A screen implant layer may be advantageously formed by thermal oxidation of substrate 22 and members 36 at the same time.

Figure 2:
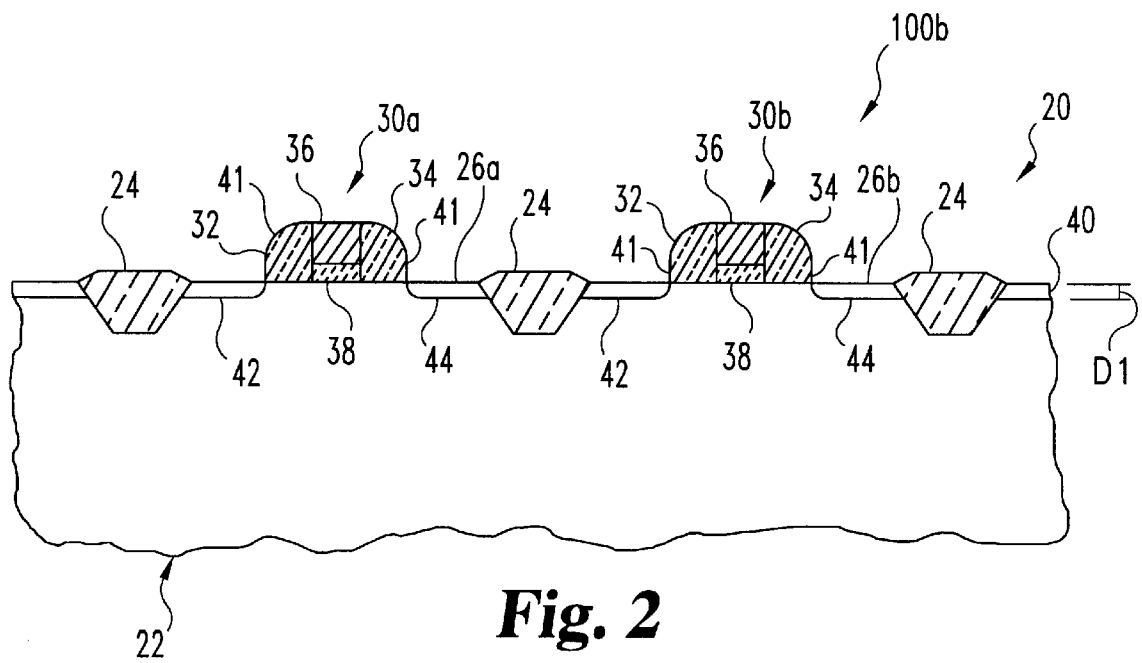

In stage 100b of FIG. 2, doped Substrate regions 42, 44 are shown as a result of the doping procedure of stage 100a. Regions 42, 44 each correspond to a source/drain pair for one of structures 30a, 30b to subsequently define an IGFET as more fully described hereinafter. Regions 42, 44 are each implanted to a maximum depth D1 as shown in FIG. 2. It should be appreciated that whether a photoresist mask is utilized or not, gate structures 30a, 30b—including spacers 32, 34—block portions of substrate 22 between regions 42, 44, preventing them from being doped. Accordingly, these features are more generally designated as masking members 41 in FIG. 2.

Figure 3:
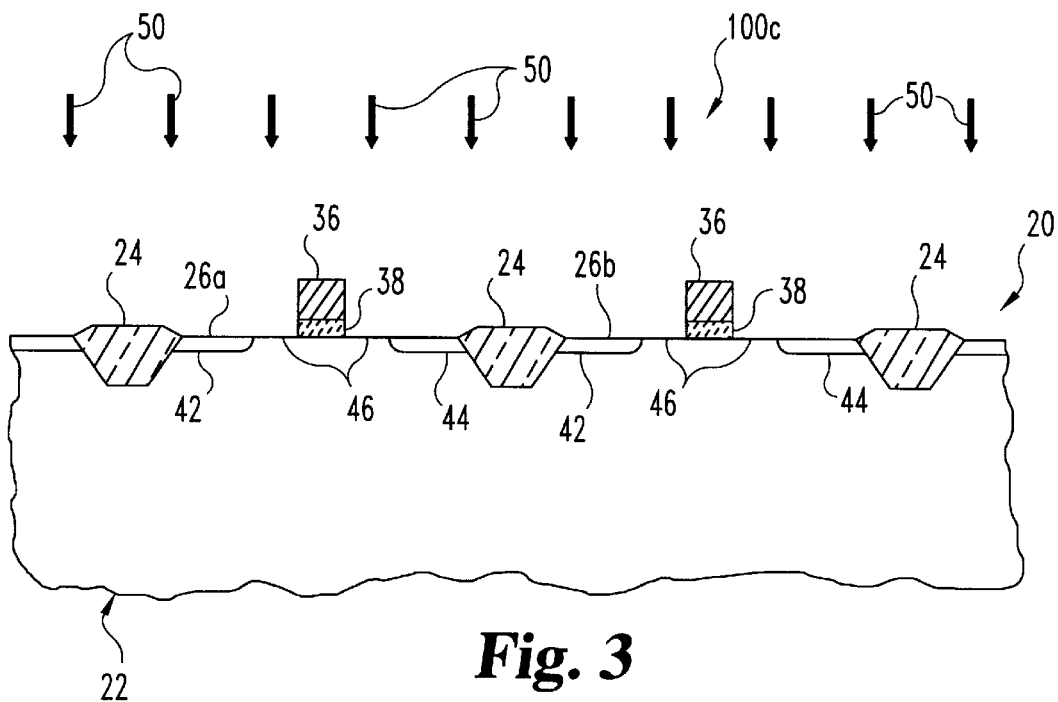

In stage 100c of FIG. 3, spacers 32, 34 of each structure 30a, 30b have been removed. For the more preferred embodiment having an undensified TEOS composition of spacers 32, 34, selective removal is preferably performed by a wet etching procedure utilizing a diluted hydrofluoric (HF) acid. Preferably, this diluted HF etchant is a range having a lower limit of about 90 parts $H_2O$ to 1 part HF (90:1), and an upper limit of about 110 parts $H_2O$ to 1 part HF (110:1). More preferably, the diluted HF etchant has a ratio of about 100:1 parts $H_2O$ to HF. For the 100:1 ratio of $H_2O$:HF, it has been found that undensified TEOS may be removed at a rate of about 4 angstroms per second vs. about 0.5 angstroms per second for a thermally formed silicon dioxide Correspondingly, a removal rate of TEOS to thermal silicon dioxide of about 8:1 is provided. However, in other embodiments, a different spacer removal technique may be utilized as would occur to those skilled in the art.

The removal of spacers 32, 34 exposes regions 46 of substrate 22. Each region 46 is positioned along substrate 22 between a corresponding structure 30a, 30b and doped substrate region 42, 44. It should be appreciated that regions 46 are a common site for formation of doped source/drain extensions sometimes called Lightly Doped Drains (LDDs). To provide these extensions, device 20 is doped at stage 100c as represented by arrows 50. Preferably, doping at stage 100c is performed by ion implantation, using the same species as utilized at stage 100a. By way of nonlimiting example, for the n conductivity type As or P may be implanted; and for the p conductivity type, B may be implanted in the form of B11 or $BF_2$. A preferred minimum concentration level for the doping of stage 100c is about $3\times10^{18}$ cm$^{-3}$; however, in other embodiments, a concentration level generally as high as that of doped source/drain regions 42, 44 intended to define a source or drain may be utilized. Accordingly, source/drain extensions may be defined by the doping of stage 100c that have a dopant concentration lower than doped regions 42, 44; or may be arranged to have a dopant concentration up to the level of doped regions 42, 44.

Figure 4:
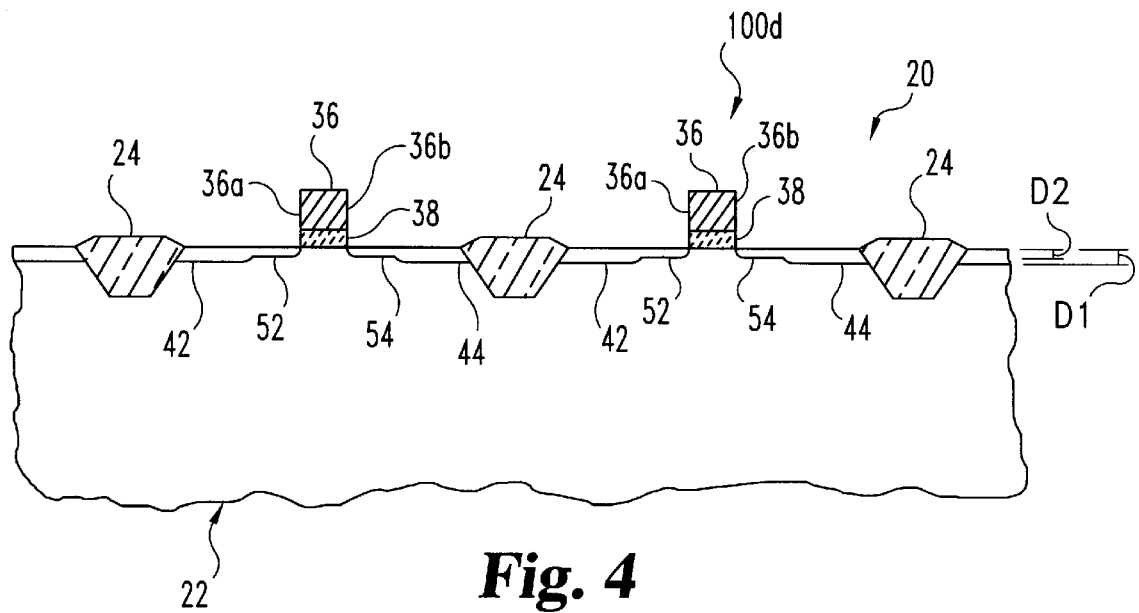

As in the case of the first doping procedure, the second doping procedure may utilize a mask to prevent doping of selected regions of device 20. The resulting doped substrate regions are designated in stage 100d of FIG. 4 by reference numerals 52 and 54. It should be appreciated that regions 52, 54 are doped to a maximum depth D2 that is less than maximum depth D1 of regions 42, 44. FIG. 4 also specifically designates opposing sidewalls 36a, 36b of members 36. Notably, because regions 42, 44 and 52, 54 are doped sequentially, removal of spacers 32, 34 may be performed by etching techniques without removing any photoresist masks that may be applied to block the application of dopant as part of the heavy doping procedure of stage 100a. Also, it should be appreciated that through stage 100c, there has been no requirement to expose device 20 to thermal cycling or otherwise require activation or distribution of dopants deposited in substrate 22 during stages 100a–100c.

Indeed, it is preferred that the dopant deposited in regions 42, 44, 52, 54 during stages 100a–100c be simultaneously activated and distributed by performing a high temperature Rapid Thermal Anneal (RTA) at stage 100d of FIG. 4. Preferably, this RTA is in a range of 850–1100° C. for one minute or less. More preferably, this RTA is in a range of about 950–1050° C. for about 30 seconds. The simultaneous activation/distribution of dopants in regions 42, 44, 52, 54 provides junctions 62, 64 as illustrated in stage 100e of FIG. 5. Junctions 62, 64 are each comprised of a source/drain profile segment 42a, 44a and a source/drain extension profile segment 52a, 54a. Source/drain profile segments 42a, 44a each have a maximum depth D3 greater than a maximum depth D4 of extension profile segments 52a, 54a. The difference between D3 and D4 is preferably at least about 100 Å. channel 60 is shown between extension profile segments 52a, 54a for each pair of junctions 62, 64.

Figure 5:
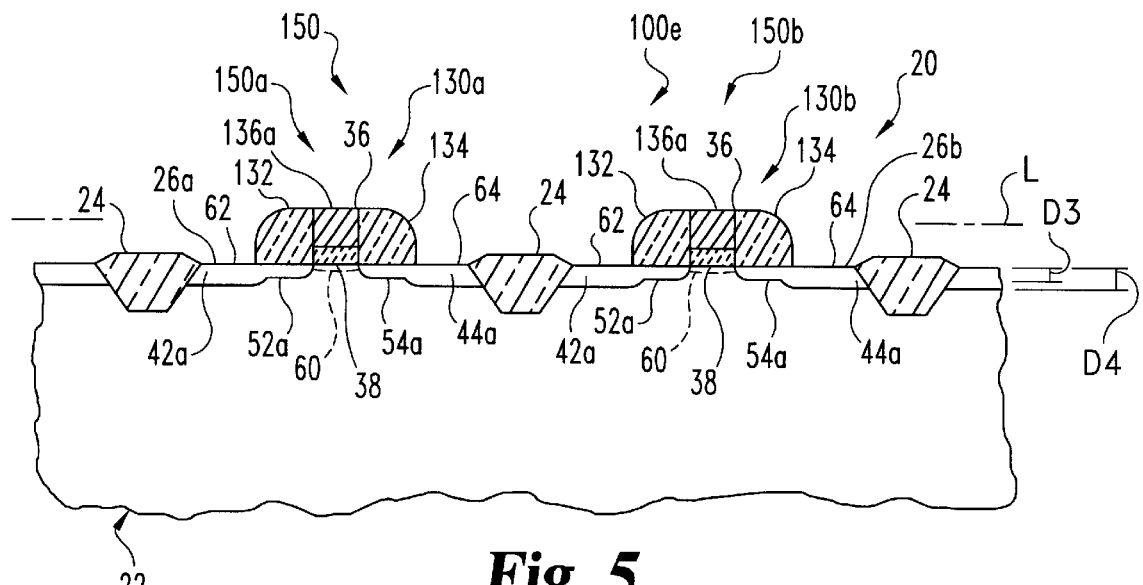

Shown in FIG. 5 is a pair of replacement spacers 132, 134 about each member 36 and pad 38 to provide modified gate structures 130a and 130b, respectively. Structure 130a, junctions 62, 64 of regions 26a, and channel 60 of region 26a collectively define Insulated Gate Field Effect Transistor (IGFET) 150a. Structure 130b, junctions 62, 64 of regions 26b, and channel 60 of region 26b collectively define Insulated Gate Field Effect Transistor (IGFET) 150b. IGFETs 150a, 150b are representative of but a few of components 150 preferred for device 20; however, additional components are not shown to preserve clarity.

Preferably, spacers 132, 134 are sized with a lateral dimension along axis L that extends beyond the lateral distance occupied by spacers 32, 34 such that spacers 132, 134 cover profile segments 52a, 54a and at least partially overlap profile segments 42a, 44a. Also, it is preferred that spacers 132, 134 each include a surface portion downwardly sloped towards substrate 22 that is positioned below top surface 136a of the corresponding member 36 from which it extends. However, in other embodiments of the present invention, a different spacer shape and/or size may be utilized as would occur to those skilled in the art. Spacers 132, 134 are preferably formed from a dielectric material using conventional techniques. In a more preferred embodiment, spacers 132, 134 are each formed by plasma etching a TEOS blanket deposited on device 20 in the manner described in connection with the more preferred embodiment of spacers 32, 34. Still, in alternative embodiments, other compositions, and formation techniques for spacers 132, 134 may be utilized as would occur to those skilled in the art.

Preferably, IGFETs 150a, 150b have a critical dimension of less than or equal to about 0.2 microns. For IGFETs 150a, 150b having a critical dimension of less than or equal to about 0.2 microns, it is preferred that junctions 62, 64 have an overall maximum depth D3 of less than or equal to about 1500 Å. The simultaneous activation and distribution of doped substrate regions 42, 44 and doped substrate regions 52, 54 by the same RTA is useful in achieving this goal, because it reduces the number of thermal cycles likely to deepen junctions 62, 64. Nonetheless, it should be understood that in other embodiments of the present invention a different junction maximum thickness may be desired, and/or a different thermal cycling or annealing strategy may be utilized.

Figure 6:
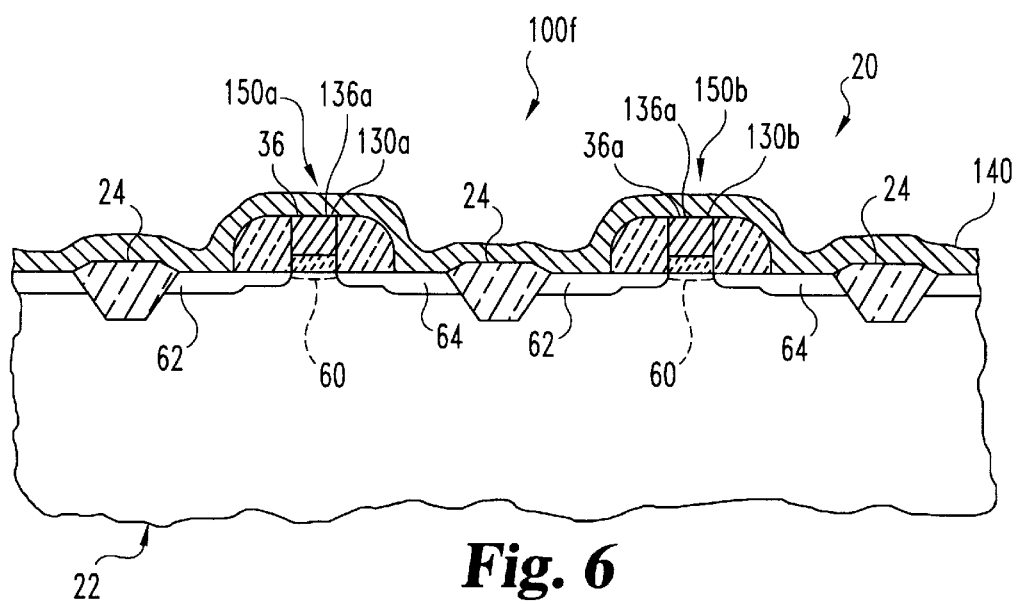

In stage 100f of FIG. 6, the formation of suicide contact areas is initiated by depositing metallic layer 140. Layer 140 contacts exposed regions of substrate 22 over junctions 62, 64 and top surfaces 136a of members 36. Layer 140 preferably includes tungsten (W), titanium (Ti), cobalt (Co), nickel (Ni), tantalum (Ta), or platinum (Pt). Layer 140 is reacted with silicon of substrate 22 and members 36 to correspondingly form a silicide film. In one preferred embodiment, layer 140 is comprised of titanium that is applied to device 20 by a sputter deposition technique to a thickness of between about 200 and 400 angstroms. Next, a first RfA is performed by heating device 20 to about 700° C. for 30 seconds, creating an intermediate silicide compound C49-TiSi$_2$ crystal structure where layer 140 contacts silicon. This first RTA is preferably performed with device 20 in an ambient nitrogen (N$_2$) gas environment. After the first RTA, any unreacted metal of layer 140 is then stripped using a wet etch technique. To provide a lower sheet resistance, a second RTA may be performed to convert the silicide crystal structure to a C54-TiSi$_2$ phase. It is preferred that this second RTA be performed at a temperature of less than or equal to about 850° C. for about 30 seconds. In other embodiments, a different composition of layer 140 and correspondingly a different silicidation procedure may be utilized as would occur to those skilled in the art.

Figure 7:
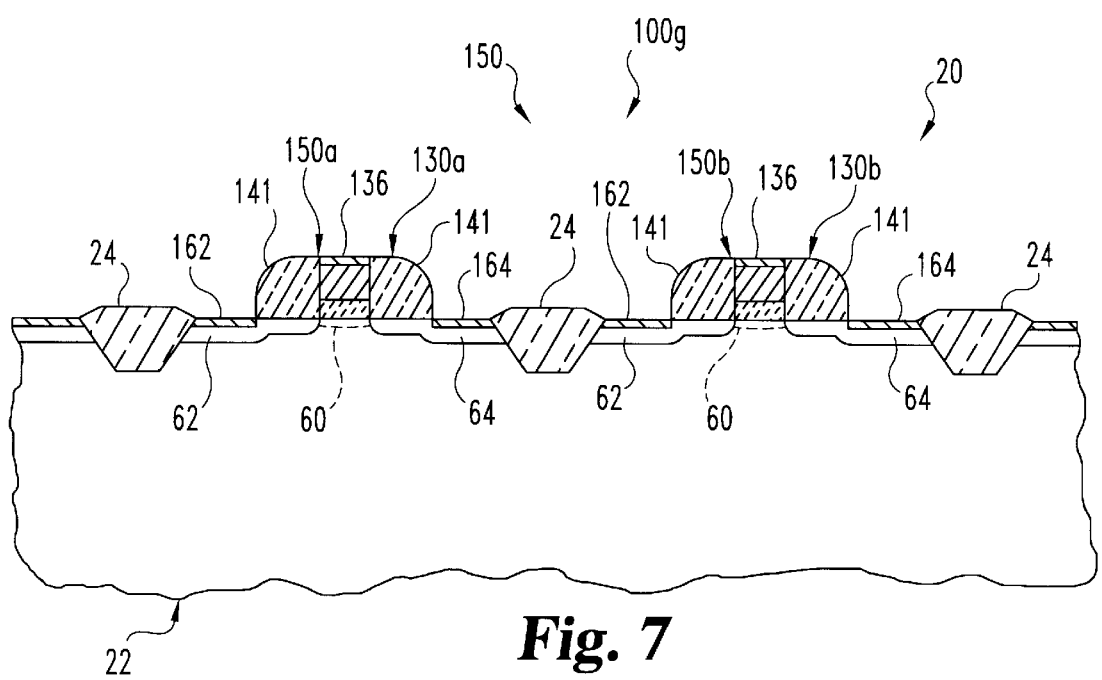

Referring to stage 100g of FIG. 7, suicide substrate contact areas 162, 164 and silicide gate contact areas 136 are shown after stripping of unreacted portions of layer 140. It should be appreciated that thermal cycling associated with silicide formation occurs after the higher temperature RTA utilized to provide junctions 62, 64. Also, thermal cycling for silicidation occurs at relatively lower temperatures that generally do not significantly deepen junctions 62, 64 for most common substrate/dopant materials. Furthermore, compared to some conventional processes, the formation of junctions 62, 64 generally involves fewer thermal cycles; and no RTAs are required between the doping procedures of stages 100a, 100c, respectively. Nevertheless, in other embodiments of the present invention, one or more additional thermal cycles may be utilized as would occur to those skilled in the art, and may be of a type that tends to redistribute dopants in substrate 22.

The sizing of spacers 132, 134 to be relatively wider than spacers 32, 34 provides a longer distance between source/drain areas of substrate 22 and the gate electrode surface of members 36, tending to reduce the unwanted formation of low resistance electrical leakage pathways between gate members 36 and corresponding source/drain regions as a side effect of the silicidation process. Indeed, spacers 132, 134 are alternatively designated as blocking or masking members 141 in FIG. 7.

Moreover, with a wider spacer, interfacial resistance between silicide contact areas and the silicide substrate may be reduced because of the relatively high doping concentration along the edge of spacers 132, 134. In contrast, for conventional processes utilizing a spacer to define the boundary between an LDD substrate area and a more heavily doped source/drain substrate area, the carrier concentration immediately below the spacer edge is relatively low, generally leading to a relatively high interfacial resistance. In other embodiments, the doping procedure of the present invention may be utilized in addition to other doping procedures for different devices. Moreover, the application of a wider spacer overlapping heavily doped regions may be utilized with or without the reduced RTA doping procedures of the present invention. Preferably, spacers 132, 134 of the present invention extend at least about 50 Å microns along axis L over the heavily doped source/drain profile segments 62a, 64a. However, in other embodiments, It should be appreciated that spacers 132, 134 with a different dimension along axis L or a different shape are envisioned. In fact, in alternative embodiments, spacers 132, 134 may be formed without overlapping source/drain areas and may only partially extend over source/drain extensions. Indeed, in one alternative form, spacers 132, 134 are absent and the silicidation process described in connection with stages 100f and 100g is not performed.

After stage 100g, device 20 may be further processed. In one embodiment, one or more metallization layers may be fabricated to selectively contact and interconnect components 150 via suicide contact areas 136, 162, 164, or otherwise, and external contact pads may be established for electrical interconnection to other devices. Device 20 may be a part of a semiconductor wafer that is separated into a number of individual integrated circuit chips after performance of selected manufacturing operations, such as stages 100a–100g. After electrical interconnections are formed, packaging may take place, including the formation of external electrical interconnections, such as wire bonds, with any established contact pads as appropriate.

It should be understood that device 20 is illustrated in a partial view that shows only a few representative integrated circuit components 150—namely IGFETs 150a, 150b. Other embodiments may have a greater quantity or variety of integrated circuit components than depicted. The principles of the present invention may be applied to provide "n" type transistors (sometimes referred to as NMOS transistors), "p" type transistors (sometimes referred to a PMOS transistors), or both, including pairing of both types to provide CMOS circuitry. Similarly, in other embodiments of the present invention, different active or passive integrated circuit component types as would occur to those skilled in the art may additionally or alternatively be included, such as bipolar transistors, dedicated volatile or nonvolatile memory cells, fuses, resistors, or capacitors to name only a few. Further, a different number, arrangement, or spacing of isolation structures 24 may be utilized in other embodiments as would occur to those skilled in the art. In one preferred embodiment, it is envisioned that many more isolation structures 24 will be utilized to define a corresponding number of additional active component areas along substrate 22. Also, other types of isolation structures may be mixed or combined with those of the present invention. In another non-limiting aspect, the teachings of the present invention may be applied to any device for which a reliable, shallow semiconductor junction is desired.

It should be noted that implementation of the disclosed embodiments of the present invention is not limited to the depicted process flows in the figures. it is understood that preparation of devices in accordance with the present invention may be incorporated in other process flows known to those skilled in the art. Moreover, processes of the present invention may be altered, rearranged, substituted, deleted, duplicated, combined, or added to other processes as would occur to those skilled in the art without departing from the spirit of the present invention. Additionally or alternatively, the various stages, procedures, techniques, phases, and operations within these processes may be altered, rearranged, substituted, deleted, duplicated, or combined as would occur to those skilled in the art.

All publications, patents, and patent applications cited in this specification are herein incorporated by reference as if each individual publication, patent, or patent application were specifically and individually indicated to be incorporated by reference and set forth in its entirety herein. While the invention has been illustrated and described in detail in the drawings and foregoing description, the same is to be considered as illustrative and not restrictive in character, it being understood that only the preferred embodiments have been shown and described and that all changes, modifications and equivalents that come within the spirit of the invention as defined by the following claims are desired to be protected.

What is claimed is:

1. A method, comprising:
   (a) providing an integrated circuit substrate with a transistor gate member extending therefrom, the member being bounded by a first spacer and a second spacer;
   (b) doping a source region and a drain region of the substrate, the first spacer masking a first region of the substrate between the source region and the member and the second spacer masking a second region of the substrate between the drain region and the member during said doping;
   (c) removing the first spacer and the second spacer after said doping;
   (d) establishing a first source/drain extension in the first region and a second source/drain extension in the second region by doping the first region and the second region after said removing;
   (e) heating the substrate after said establishing to simultaneously activate dopant provided by said doping the source region and the drain region and dopant provided by said doping the first region and the second region;
   (f) forming a third spacer on the first region and a fourth spacer on the second region; and
   (g) providing a silicide contact with at least one of the member, the source region, and the drain region after the third spacers and the fourth spacer are formed.

2. The method of claim 1, wherein the source region, the drain region, the first region, and the second region are all doped to be of the same conductivity type.

3. The method of claim 2, wherein the source region and drain region are doped to a first maximum depth and the first source/drain extension and the second source/drain extension are doped to a second maximum depth less than the first maximum depth.

4. The method of claim 2, wherein the source and drain are doped with a greater dopant concentration than the first source/drain region and the second source drain region.

5. The method of claim 1, wherein the member belongs to an insulated gate field effect transistor having a critical dimension of less than about 0.20 microns.

6. The method of claim 1, wherein the third spacer is wider than the first spacer to partially overlap the source region, and the fourth spacer is wider than the second spacer to partially overlap the drain region.

7. The method of claim 1, wherein:
   the substrate includes a plurality of source regions and drain regions each corresponding to one of a plurality of insulated gate field effect transistor members extending away from the substrate with a corresponding pair of spacers, the plurality of source and drain regions being doped to a first maximum depth during said doping;
   said removing includes removing the corresponding pair of spacers for each of the insulated gate members to uncover a corresponding pair of regions, the pair of regions for each of the insulated gate members being doped to a second maximum depth less than the first maximum depth during said establishing;
   said forming includes providing a pair of replacement spacers for each of the insulated gate members after said heating; and
   said providing the silicide contact further includes providing a plurality of silicide contacts.

8. A method, comprising:
   (a) doping an integrated circuit substrate to provide a first pair of doped substrate regions, a transistor gate member with a first pair of spacers extending from the substrate between the first doped regions;
   (b) removing the first spacers after the first doped regions are formed and before annealing the first pair of doped regions;
   (c) doping the substrate after said removing to provide a second pair of doped substrate regions each being doped with a shallower profile than the first doped regions, the second doped regions each being positioned along the substrate between a corresponding one of the first doped regions and the gate member;
   (d) forming a second pair of spacers about the gate member after the second doped regions are formed; and
   (e) heating the substrate to anneal the first doped regions and the second doped regions after the second doped regions are formed.

9. The method of claim 8, wherein said heating includes performing a rapid thermal anneal at a temperature of at least about 950° C. for less than about 30 seconds.

10. The method of claim 8, wherein said doping of the first doped regions includes implanting a first dopant and said doping of the second doped regions includes implanting a second dopant, the first dopant and the second dopant being of the same conductivity type.

11. The method of claim 8, wherein the first doped regions are doped with a greater dopant concentration than the second doped regions.

12. The method of claim 8, wherein the second spacers each cover a respective one of the second doped regions and partially extend over the corresponding one of the first doped regions.

13. The method of claim 8, wherein the gate member corresponds to an insulated gate of a field effect transistor, the substrate defines a channel between the second doped regions for the transistor, and the first doped regions each correspond to a source or a drain of the transistor.

14. The method of claim 13, further comprising:
   defining a plurality of active areas along the substrate, the areas each being electrically isolated from another by at least one of a number of shallow trenches in the substrate, the trenches each being at least partially filled with an electrically insulating material; and
   defining at least one of a plurality of insulated gate field effect transistors in each of the active areas.

15. A method, comprising:
   (a) performing a first dopant implant into a source region and a drain region of an integrated circuit substrate a transistor gate member extending from the substrate between the source and drain regions, a first pair of spacers bounding the gate member, one of the first spacers masking a first region between the source region and the gate member during the first implant and another of the first spacers masking a second region between the drain region and the gate member during the first implant, the first spacers each being formed from tetraethylorthosilicate (TEOS);
   (b) etching away the first spacers after the first implant is performed;
   (c) performing a second dopant implant after said etching and before annealing the source region and the drain region for the first implant to dope the first and second regions with a dopant of the same conductivity type as implanted in the source and drain regions, said performing defining a first source/drain extension in the first region and a second source/drain extension in the second region; and (d) forming a second pair of spacers about the gate member.

16. The method of claim 15, further comprising depositing a layer of TEOS on the substrate and the gate member before said performing the first dopant implant, and plasma etching the layer to form the first spacers.

17. The method of claim 15, wherein said etching is performed with a mixture of about 100 parts $H_2O$ to about 1 part HF.

18. The method of claim 15, wherein the substrate defines a number of trenches each at least partially filled with an insulating material exposed to said etching, and said etching removes the first spacers faster than the insulating material; and further comprising defining a plurality of active areas along the substrate between the trenches and defining at least one of a plurality of insulated gate field effect transistors in each of the active areas.

19. The method of claim 15, wherein the second spacers each include a downwardly sloped segment positioned below an exposed silicon surface of the gate member after said forming the second spacers.

20. The method of claim 15, wherein the first dopant implant has a first maximum depth and the second dopant implant has a second maximum depth less than the first maximum depth.

21. The method of claim 20, further comprising providing a silicide contact on at least one of the source region, the drain region, or the gate member after said forming.

22. A method, comprising:
(a) providing an integrated circuit substrate with a transistor gate member extending therefrom, the gate member being bounded by a first pair of spacers;
(b) doping the substrate to provide a first pair of doped substrate regions, the gate member and the first spacers being positioned between the first doped regions;
(c) removing the first spacers after the first doped regions are formed;
(d) doping the substrate after said removing to provide a second pair of doped substrate regions, the second doped regions each being positioned along the substrate between a corresponding one of the first doped regions and the gate member; and
(e) forming a second pair of spacers each extending along the substrate from a sidewall of the gate member over a corresponding one of the second doped regions, the second spacers each including a downwardly sloped surface positioned below a surface of the gate member after said forming; the second spacers each being wider than a respective one of the first spacers to at least partially extend over the corresponding one of the first doped regions.

23. The method of claim 22, wherein said forming includes depositing an insulating layer on the substrate and the gate member after providing the second doped regions, and plasma etching the layer to form the second pair of spacers.

24. The method of claim 22, wherein the second spacers each include a rounded shoulder defining the sloped surface.

25. The method of claim 22, wherein the first doped regions have a first maximum depth and the second doped regions have a second maximum depth less than the first maximum depth.

26. The method of claim 25, wherein the second spacers are formed from an insulating material and further comprising providing a silicide contact on at least one of the heavily doped regions or the gate member after said forming.

27. The method of claim 25, further comprising forming the first spacers from tetraethylorthosilicate.

28. The method of claim 22, wherein the first doped regions and the second doped regions are each doped by implanting a dopant of the same conductivity type.

29. A method, comprising:
doping a source region and a drain region of an integrated circuit device with dopant, the device including a first pair of spacers bounding a transistor gate member, one of the first spacers masking a first region between the source region and the gate member and another of the first spacers masking a second region between the drain region and the gate member during said doping;
removing the first spacers after said doping and before activation of the dopant;
doping the first region and the second region with further dopant after said removing to define a first source/drain extension in the first region and a second source/drain extension in the second region; and
heating the substrate to simultaneously activate the dopant provided by said doping the source region and the drain region and the further dopant provided by said doping the first region and the second region; and
forming a second pair of spacers each extending from opposite sides of the gate member.

30. The method of claim 29, further comprising providing a silicide contact with at least one of the gate member, the source region, and the drain region after the second spacers are formed.

31. The method of claim 29, wherein the first spacers are formed from TEOS and said removing includes etching away the first spacers.

32. The method of claim 29, wherein a first one of the second spacers is wider than a first one of the first spacers to at least partially extend over the source region and a second one of the second spacers is wider than a second one of the first spacers to at least partially extend over the drain region.

33. The method of claim 32, further comprising providing a silicide contact with at least one of the gate member, the source region, and the drain region after the second spacers are formed.

34. The method of claim 33, wherein:
the first spacers are comprised of TEOS and said removing including etching the first spacers with a mixture of about 100 parts $H_2O$ to about 1 part HF; and
the substrate defines a number of trenches each at least partially filled with an insulating material exposed to said etching, and said etching removes the first spacers faster than the insulating material; and further comprising defining a plurality of active areas along the substrate between the trenches and defining at least one of a plurality of insulated gate field effect transistors in each of the active areas.

* * * * *